US011449110B2

(12) United States Patent
Lin et al.

(10) Patent No.: US 11,449,110 B2
(45) Date of Patent: Sep. 20, 2022

(54) COMPUTER ENCLOSURE

(71) Applicant: HONG FU JIN PRECISION INDUSTRY (WuHan) CO., LTD., Wuhan (CN)

(72) Inventors: Yi-Sheng Lin, New Taipei (TW); Ding Chen, Wuhan (CN)

(73) Assignee: HONG FU JIN PRECISION INDUSTRY (WuHan) CO., LTD., Wuhan (CN)

( * ) Notice: Subject to any disclaimer, the term of this patent is extended or adjusted under 35 U.S.C. 154(b) by 87 days.

(21) Appl. No.: 16/919,430

(22) Filed: Jul. 2, 2020

(65) Prior Publication Data
US 2021/0223830 A1 Jul. 22, 2021

Related U.S. Application Data

(63) Continuation-in-part of application No. PCT/CN2020/072827, filed on Jan. 17, 2020.

(51) Int. Cl.
*G05F 1/00* (2006.01)
*G06F 1/18* (2006.01)
*H05K 5/02* (2006.01)

(52) U.S. Cl.
CPC ........... *G06F 1/181* (2013.01); *H05K 5/0221* (2013.01)

(58) Field of Classification Search
CPC ...... G06F 1/181; H05K 5/0226; H05K 5/023; H05K 5/0021; H05K 5/0208; H05K 5/03; H05K 5/02; H05K 5/0239; H05K 5/0217; H05K 5/0221; H05K 5/0204; H05K 7/1487; H05K 7/1488

USPC ............... 312/223.2; 220/345.1, 351, 345.4; 361/379.33, 679.37, 679.58, 726, 727
See application file for complete search history.

(56) References Cited

U.S. PATENT DOCUMENTS

| 5,420,760 A  | * | 5/1995  | Ansell ..................... G06F 1/181 361/752 |
| 7,735,669 B2 | * | 6/2010  | Liang ...................... G06F 1/181 220/4.21 |
| 8,016,372 B2 | * | 9/2011  | Yeh ....................... H05K 9/0009 361/818 |
| 8,837,129 B2 | * | 9/2014  | Fu ......................... H05K 7/1487 361/679.02 |
| 9,696,769 B1 | * | 7/2017  | Hamilton ........... H05K 7/20127 |
| 10,798,837 B1 | * | 10/2020 | Sauer ................... H05K 7/1488 |
| 2010/0007252 A1 | * | 1/2010  | Liu .......................... G06F 1/183 361/728 |
| 2010/0327713 A1 |   | 12/2010 | Wang et al. |

(Continued)

FOREIGN PATENT DOCUMENTS

| CN | 1875166 A | 12/2006 |
| CN | 101930260 A | 12/2010 |

(Continued)

*Primary Examiner* — Janet M Wilkens
(74) *Attorney, Agent, or Firm* — ScienBiziP, P.C.

(57) ABSTRACT

An enclosure for a computer proofed against being accidentally opened includes a cabinet and a cover plate, the cabinet defines a first chute, the cover plate includes a first hook structure, the first hook structure cooperates with the first chute to cover the cover plate on the cabinet. The cabinet defines a groove in the first chute, the first hook structure comprises a locking portion, and the locking portion is used to engage with the groove.

14 Claims, 7 Drawing Sheets

(56) References Cited

U.S. PATENT DOCUMENTS

| | | | | |
|---|---|---|---|---|
| 2012/0287573 | A1* | 11/2012 | Anguiano-Wehde | ........................ H05K 7/1487 361/679.58 |
| 2014/0062273 | A1* | 3/2014 | Lee | ...................... H05K 5/0221 403/14 |
| 2019/0394889 | A1* | 12/2019 | Wu | ......................... G06F 1/181 |
| 2020/0159970 | A1* | 5/2020 | Shih | ..................... H05K 5/0239 |

FOREIGN PATENT DOCUMENTS

| | | | |
|---|---|---|---|
| CN | 111367369 | * | 7/2020 |
| EP | 3623901 | * | 3/2018 |
| WO | 2021142790 | * | 7/2021 |

\* cited by examiner

COMPUTER ENCLOSURE

FIELD

The subject matter herein generally relates to a computer enclosure.

BACKGROUND

In general, a computer enclosure includes a cabinet, a cover plate, and a panel. The computer enclosure case includes a lower side plate, and the cover plate includes an upper side plate. The lower side plate defines a sliding groove and a locking hole, and the upper side plate defines a hook and a through hole. The locking hole is aligned with the through hole, a locking member passes through the locking hole and the through hole, and the cover plate is fixed on the cabinet. The cabinet, the cover plate, and the panel together form an accommodating space to contain electronic components for a computer.

However, there may be a gap between the cover plate and the panel when the cover plate is fixed on the cabinet. When an external force is applied to the cover plate along the gap, the cover plate may be severely deformed and bent upward, causing the hooks of the cover plate to fall out of the chute of the cabinet. The cabinet will be easily opened, greatly reducing the safety of the cabinet.

Therefore, improvement is desired.

BRIEF DESCRIPTION OF THE DRAWINGS

Implementations of the present disclosure will now be described, by way of embodiments, with reference to the attached figures.

DETAILED DESCRIPTION

Figure 1:
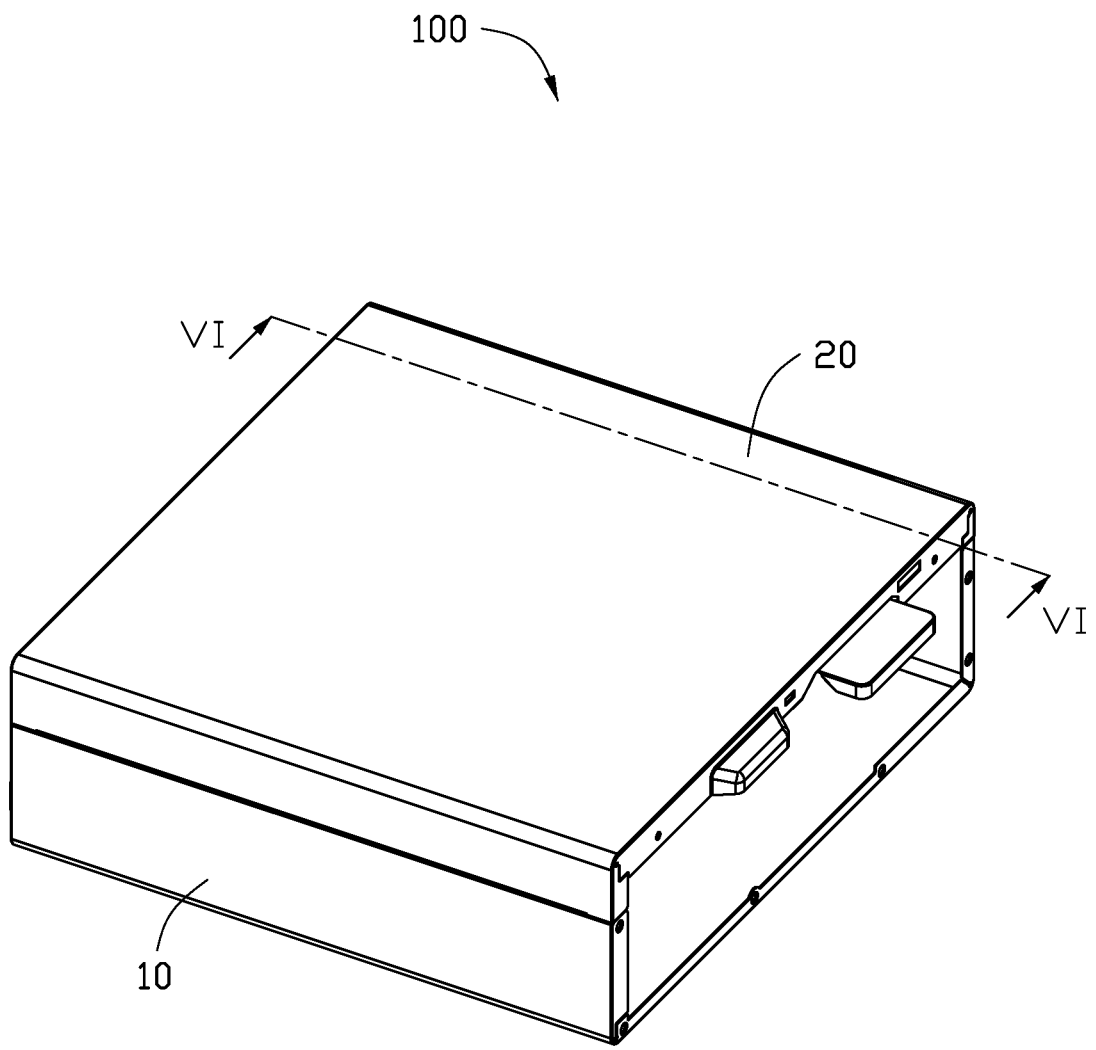
FIG. 1 is a diagram of one embodiment of an assembled computer enclosure of the present disclosure, the computer enclosure is in a closed state.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

FIG. 1 illustrates a computer enclosure 100 in accordance with an embodiment of the present disclosure.

The computer enclosure 100 includes a cabinet 10 and a cover plate 20. The cabinet 10 and the cover plate 20 form a receiving space to receive electronic components (such as motherboard, hard disk, fan, and power supply).

Figure 2:
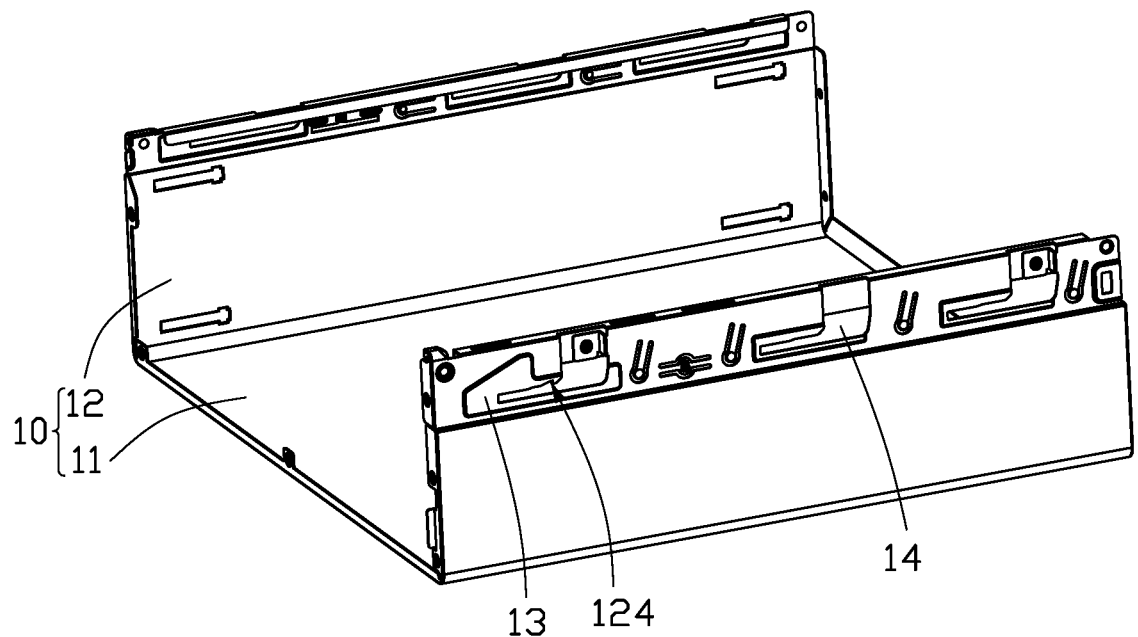
FIG. 2 is a perspective view of an embodiment of a cabinet of the computer enclosure of FIG. 1.
Figure 3:
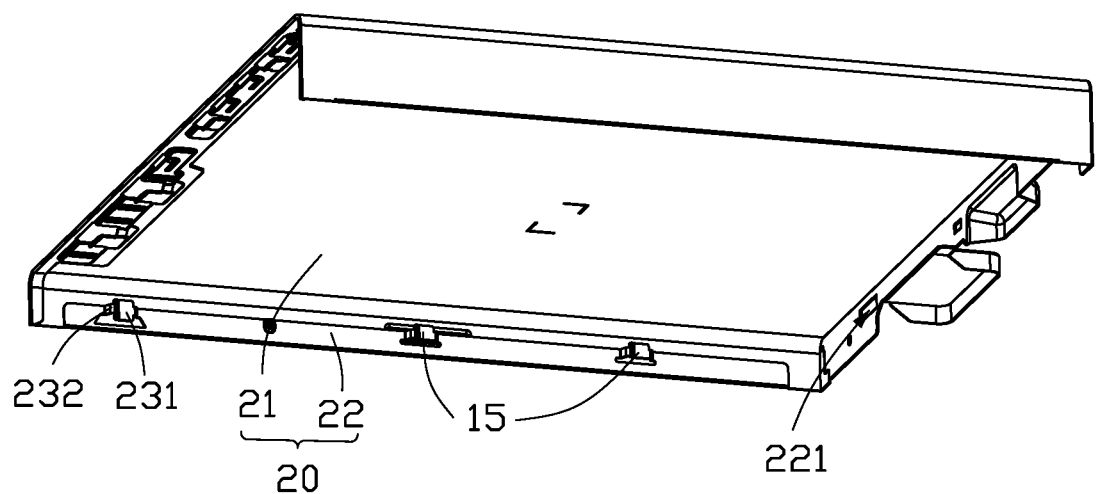
FIG. 3 is a perspective view of an embodiment of a cover plate of the computer enclosure of FIG. 1.

FIGS. 2 and 3 illustrate that the cabinet 10 defines a first chute 13. The cover plate 20 includes a first hook structure 231, and the first hook structure 231 cooperates with the first chute 13 to cover the cover plate 20 on the cabinet 10. The cabinet 10 defines a groove 124 at the first chute 13, the first hook structure 231 includes a locking portion 232, and the locking portion 232 is used to engage with the groove 124 to prevent the computer enclosure 100 from being forcibly opened.

In the embodiment, a through hole 221 is defined at the rear end of the cover plate 20, and a locking ring (not shown) is provided on the cabinet 10. The locking ring passes through the through hole 221 and is locked by a locking member (not shown), thereby locking the cabinet 10 and the cover plate 20.

Figure 4A:
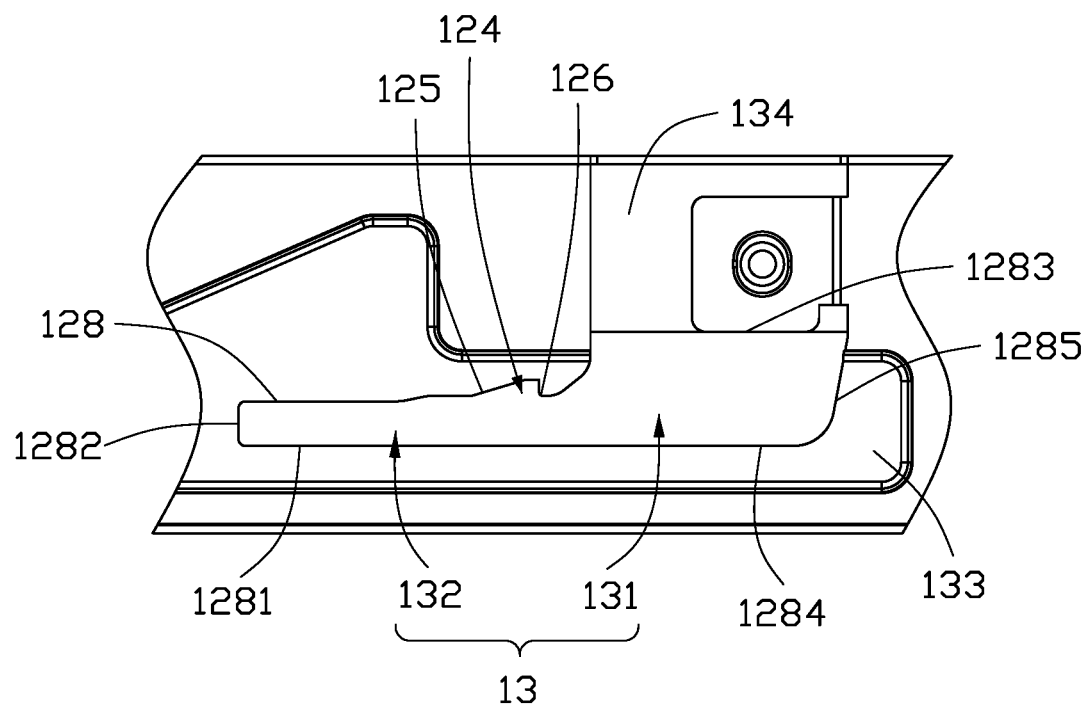
FIG. 4A is a view of an embodiment of a first chute of the cabinet of FIG. 2.

Referring to FIG. 4, the cabinet 10 includes an inclined plane 125 and a blocking portion 126, the inclined plane 125 and the blocking portion 126 together form the groove 124.

In the embodiment, the inclined plane 125 and the blocking portion 126 are spaced apart, the spacing between the inclined plane 125 and the blocking portion 126 is equal to the bottom of the groove 124. The inclined plane 125 and the blocking portion 126 form an inner wall of the groove 124, when the locking portion 232 is held in the groove 124, the locking portion 232 can enter the bottom of the groove 124 and is resisted by the inclined plane 125 and the blocking portion 126, so that the groove 124 prevents the computer enclosure 100 from being forcibly opened.

The first chute 13 includes a first sub chute 131 and a second sub chute 132, the first sub chute 131 communicates with the second sub chute 132, the width of the first sub chute 131 is greater than the width of the second sub chute 132, and the cabinet 10 forms the inclined plane 125 and the blocking portion 126 at the second sub chute 132.

In the embodiment, the first sub chute 131 is substantially rectangular, and the second sub chute 132 is generally elongated. The cabinet 10 forms the inclined plane 125 and the blocking portion 126 at the second sub chute 132 near the first sub chute 131.

The cabinet 10 further has a slot wall 128 at the second sub chute 132, the inclined plane 125 is connected to the slot wall 128, and the inclined plane 125 and the slot wall 128 form an obtuse angle. In the embodiment, the cabinet 10 has other slot walls at the second sub chute 132, for example, a first slot wall 1281 and a second slot wall 1282.

In the embodiment, the slot wall 128, the first slot wall 1281, and the second slot wall 1282 are an upper slot wall, a lower slot wall, and a left slot wall of the second sub chute 132, respectively. Obviously, the slot wall 128, the first slot wall 1281, and the second slot wall 1282 may have other denominations, for example, the slot wall 128, the first slot wall 1281, and the second slot wall 1282 can be the upper slot wall, the left slot wall, and the lower slot wall, respectively. The slot wall 128, the first slot wall 1281, and the second slot wall 1282 together form the second sub chute 132. In the embodiment, the slot wall 128 is substantially parallel to the first slot wall 1281.

Opposite ends of the second slot wall 1282 are connected to the slot wall 128 and the first slot wall 1281. When the cover plate 20 covers the cabinet 10, the locking portion 232 contacts the slot wall 128 and the first slot wall 1281. When an external force is applied to open the cover plate 20, since the slot wall 128 and the inclined plane 125 are obtusely angled in being connected to each other, the locking portion 232 will slide along the slot wall 128 to the inclined plane 125, under the guidance of the inclined plane 125, and slide into the bottom of the groove 124, resisting the locking portion 232 by the blocking portion 126. Furthermore, the locking portion 232 is engaged with the groove 124 to prevent the computer enclosure 100 from being forcibly opened.

The cabinet 10 is formed with a third slot wall 1283, a fourth slot wall 1284, and a fifth slot wall 1285 at the first sub chute 131. In the embodiment, the third slot wall 1283, the fourth slot wall 1284, and the fifth slot wall 1285 are respectively an upper slot wall, a lower slot wall, and a right slot wall of the first sub chute 131. The third slot wall 1283, the fourth slot wall 1284, and the fifth slot wall 1285 can also have other denominations, for example, the third slot wall 1283, the fourth slot wall 1284, and the fifth slot wall 1285 can respectively be the upper slot wall, the right slot wall, and the lower slot wall. The third slot wall 1283, the fourth slot wall 1284, and the fifth slot wall 1285 together form the first sub chute 131. The third slot wall 1283 is substantially parallel to the fourth slot wall 1284. The fourth slot wall 1284 is flush with the first slot wall 1281. Opposite ends of the fifth slot wall 1285 are connected to the third slot wall 1283 and the fourth slot wall 1284. The height of the fifth slot wall 1285 is greater than the height of the second slot wall 1282, and the width of the first sub chute 131 is greater than the width of the second sub chute 132.

Figure 5A:
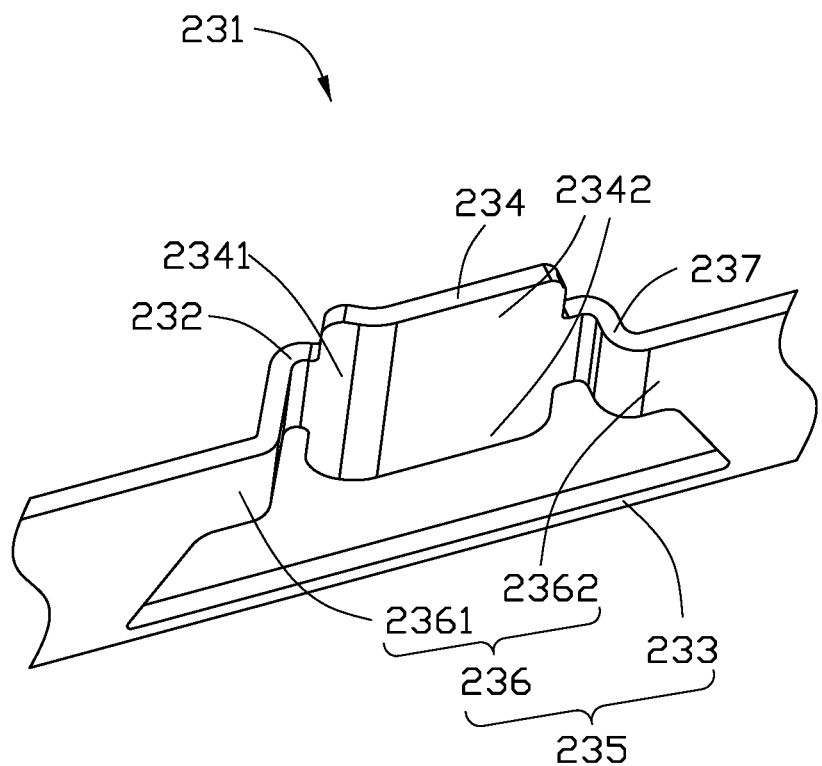
FIG. 5A is an enlarged view of an embodiment of a first hook structure of FIG. 3.

FIG. 5A illustrates that the first hook structure 231 further includes a holding plate 233 and a first fixing portion 234. The holding plate 233 and the first fixing portion 234 are spaced apart from each other, the holding plate 233 is disposed on the outside of the cabinet 10, and the first fixing portion 234 is disposed on the inside of the cabinet 10. The width of the first sub chute 131 is greater than the width of the first fixing portion 234, and the width of the second sub chute 132 is less than the width of the first fixing portion 234. The width of the locking portion 232 is less than the width of the first fixing portion 234. The first fixing portion 234 includes two clamping arms 2342. The two clamping arms 2342 extend in opposite directions from the connection between the first fixing portion 234 and the locking portion 232 and from the connection between the first fixing portion 234 and the locking portion 232. The two clamping arms 2342 are disposed on the inner side of the cabinet 10. In the embodiment, the holding plate 233 can also be used to contact the outer wall of the cabinet 10, and the first fixing portion 234 can be used to contact the inner wall of the cabinet 10.

The first hook structure 231 further includes a main body 235, and the main body 235 includes the holding plate 233 and a connecting plate 236 extending from both ends of the holding plate 233. The locking portion 232 extends from the connecting plate 236 away from the connecting plate 236. The locking portion 232 is fixedly connected to the first fixing portion 234.

In the embodiment, the connecting plate 236 includes a first connecting plate 2361 and a second connecting plate 2362. The locking portion 232 extends from the first connecting plate 2361 away from the first connecting plate 2361.

The first fixing portion 234 includes an end portion, and the end portion is disposed at an end of the first fixing portion 234 near the locking portion 232. The end portion is bent away from the holding plate 233, and the end portion forms a guiding plate 2341. The locking portion 232 is fixedly connected to the guiding plate 2341. When the first hook structure 231 slides from the first sub chute 131 to the second sub chute 132, the first connecting plate 2361 enters the second sub chute 132 before the second connecting plate 2362. Since the guiding plate 2341 is bent away from the holding plate 233, the guiding plate 2341 prevents the first fixing portion 234 from colliding with the blocking portion 126, thereby facilitating the entry of the first fixing portion 234 into the second sub chute 132, so that the first hook structure 231 slides more smoothly on the first chute 13.

The first hook structure 231 further includes a connecting portion 237. The connecting portion 237 extends from the second connecting plate 2362 away from the second connecting plate 2362, and is fixedly connected to the end of the first fixing portion 234 away from the guiding plate 2341. The connecting portion 237 is substantially L-shaped. The connecting portion 237 prevents the end of the first fixing portion 234 from being suspended.

The width of the locking portion 232 and the width of the connecting portion 237 are less than the width of the first fixing portion 234. Through the connection of the locking portion 232, the connecting portion 237, and the first fixing portion 234, the first fixing portion 234 is spaced from the holding plate 233.

Referring to FIG. 2, the cabinet 10 includes a bottom plate 11 and a first side plate 12 vertically extending from both sides of the bottom plate 11. The first chute 13 is formed on the first side plate 12, and the first side plate 12 is formed with the inclined plane 125 and the blocking portion 126 where the first chute 13 is away from the bottom plate 11. In the embodiment, the first chute 13 is disposed at the end of the first side plate 12 away from the through hole 221.

The cabinet 10 further has a first slot plate 133 and a second slot plate 134 at the first sub chute 131. The first slot plate 133 extends vertically from the bottom plate 11, and is close to the bottom plate 11 relative to the second slot plate 134. The first slot plate 133 is connected to the second slot plate 134 and these together form the first side plate 12. The cabinet 10 has the first chute 13 at the point of connection of the first slot plate 133 and the second slot plate 134. The inclined plane 125 and the blocking portion 126 are formed on the second slot plate 134. The holding plate 233 is arranged outside the first slot plate 133, and the first fixing portion 234 is arranged inside the first slot plate 133 and the second slot plate 134. The holding plate 233 is in contact with the outer wall of the first slot plate 133, and the first fixing portion 234 is in contact with the inner wall of the first slot plate 133 and the second slot plate 134.

In the embodiment, the holding plate 233 is disposed outside the first slot plate 133 at the first chute 13, and the first fixing portion 234 is disposed inside of the second slot plate 134 and the first slot plate 133. Therefore, when the first hook structure 231 slides from the first sub chute 131 into the second sub chute 132, the first hook structure 231 can pass outside the first slot plate 133 and snap into the first chute 13, so as to cover the cover plate 20 on the cabinet 10.

When an external force acts on a top plate 21 of the cover plate 20, the two clamping arm 2342 of the first fixing portion 234 engage with the inside of the first slot plate 133 and the inner side of the second slot plate 134. When the top plate 21 and the first hook structure 231 are deformed by pressing, the first fixing portion 234 is easily detached from the first chute 13.

In the embodiment, the space and distance between the blocking portion 126 and the first slot plate 133 are for the locking portion 232 to pass through. The slot wall 128 and the third slot wall 1283 are formed on the second slot plate 134, and the slot wall 128 and the third slot wall 1283 are both flat on the second slot plate 134. The first slot wall 1281, the second slot wall 1282, the fourth slot wall 1284, and the fifth slot wall 1285 are formed on the first slot plate 133, the first slot wall 1281, the second slot wall 1282, the fourth slot wall 1284, and the fifth slot wall 1285 are flat on the first slot plate 133. The slot wall 128, the first slot wall 1281, and the second slot wall 1282 together form an end of the second sub chute 132. The third slot wall 1283, the fourth slot wall 1284, and the fifth slot wall 1285 together form an end of the first sub chute 131. Each slot wall is flat, thus the locking portion 232 can slide on the first slot plate 133 and the second slot plate 134.

The cover plate 20 includes the top plate 21 and a second side plate 22 vertically extending from both sides of the top plate 21. The first hook structure 231 is formed on the inner surface of the second side plate 22, the holding plate 233 is away from the top plate 21 relative to the first fixing portion 234. In the embodiment, the holding plate 233 and the connecting plate 236 of the first hook structure 231 are fixedly connected to the inner wall of the second side plate 22, so that the first hook structure 231 is fixedly disposed on the inner wall of the second side plate 22.

Figure 4B:
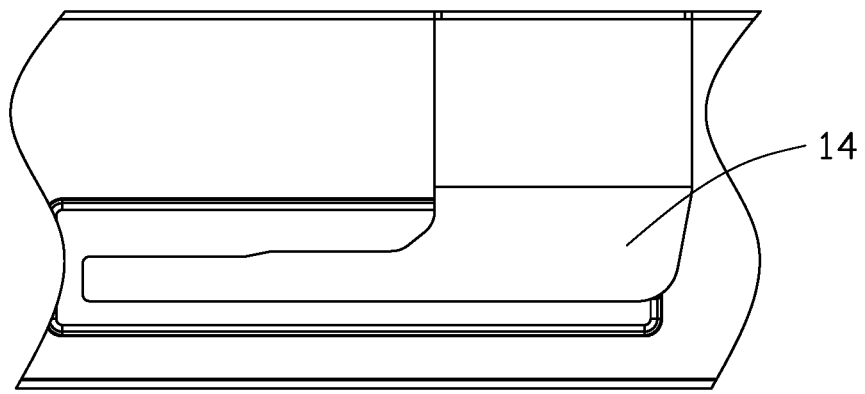
FIG. 4B is an enlarged view of an embodiment of a second chute.

Referring to FIG. 2 and FIG. 4B, in the embodiment, the first side plate 12 further has at least one second chute 14. The structure of the second chute 14 is substantially the same as the structure of the first chute 13 except that the second chute 14 omits the inclined plane 125 and the blocking portion 126.

Figure 5B:
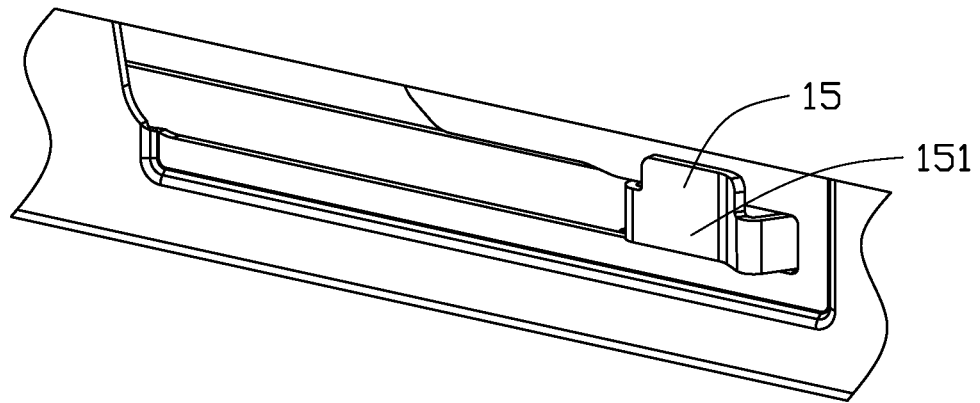
FIG. 5B is an enlarged view of an embodiment of a second hook structure of FIG. 3.

Referring to FIGS. 3 and 5B, the second side plate 22 is further provided with at least one second hook structure 15. The structure of the second hook structure 15 is substantially the same as the structure of the first hook structure 231, except that a second fixing portion 151 includes only one clamping arm 2342, instead of two clamping arms 2342. That is, the clamping arm 2342 close to the holding plate 233 is omitted, thus when the second hook structure 15 slides into the second sub chute 132, the second fixing portion 151 is in contact with the second slot plate 134.

Referring to FIG. 3, the first hook structure 231 is disposed at an end of the second side plate 22 away from the through hole 221. The second hook structure 15 is disposed at an end of the second side plate 22 close to the through hole 221. The first chute 13 and the second chute 14 correspond to the first hook structure 231 and the second hook structure 15. The first hook structure 231 and the first chute 13 are mutually locked, and the second hook structure 15 and the second chute 14 are mutually locked, which ensures the safety of the computer enclosure 100, and ensures smooth sliding of the cover plate 20 on the cabinet 10.

In the embodiment, the number of the first hook structures 231 corresponds to the number of the first chutes 13, and the number of the second hook structures 15 corresponds to the number of the second chutes 14.

Figure 6:
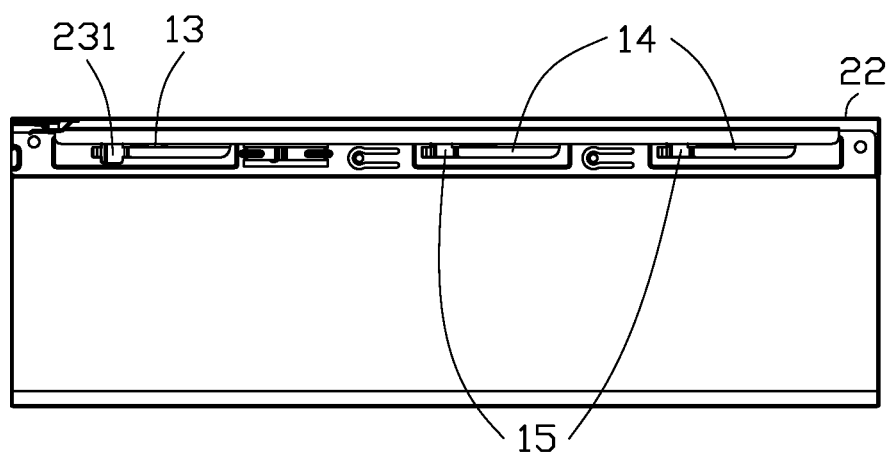
FIG. 6 is a schematic cross-sectional view along line VI-VI of FIG. 1.

Referring to FIG. 6, when the cover plate 20 covers the cabinet 10, the first hook structure 231 and the second hook structure 15 respectively correspond to the first chute 13 and the second chute 14 and interlock with each other.

The process of covering the cover plate 20 and the cabinet 10 with the cooperation of the first hook structure 231 and the first chute 13 is that when the cover plate 20 is closed to the cabinet 10, the first fixing portion 234 of the first hook structure 231 passes through the first sub chute 131 from the outer side of the cabinet 10. The holding plate 233 of the first hook structure 231 is still disposed outside the first slot plate 133. When the first hook structure 231 slides along the first sub chute 131 and slides into the second sub chute 132, the upper and lower ends of the locking portion 232 slide against the slot wall 128 and the first slot wall 1281 respectively. The first fixing portion 234 is disposed inside the first slot plate 133 and the second slot plate 134 and slides along the inner wall of the first slot plate 133 and the second slot plate 134. The holding plate 233 continues to slide along the outer side of the first slot plate 133 until the cover plate 20 is completely aligned with both ends of the cabinet 10.

The locking process of the second hook structure 15 and the second chute 14 is similar to the locking process of the first hook structure 231 and the first chute 13, except that the second fixing portion 151 of the second hook structure 15 only includes one clamping arm 2342 instead of two. When the second hook structure 15 slides into the second sub chute 132 of the second chute 14, the second fixing portion 151 only makes contact with the second slot plate 134.

After the cover plate 20 is completely aligned with both ends of the cabinet 10, the cabinet 10 and the cover plate 20 are locked by a locking member (not shown) to complete the locking of the computer enclosure 100.

Figure 7:
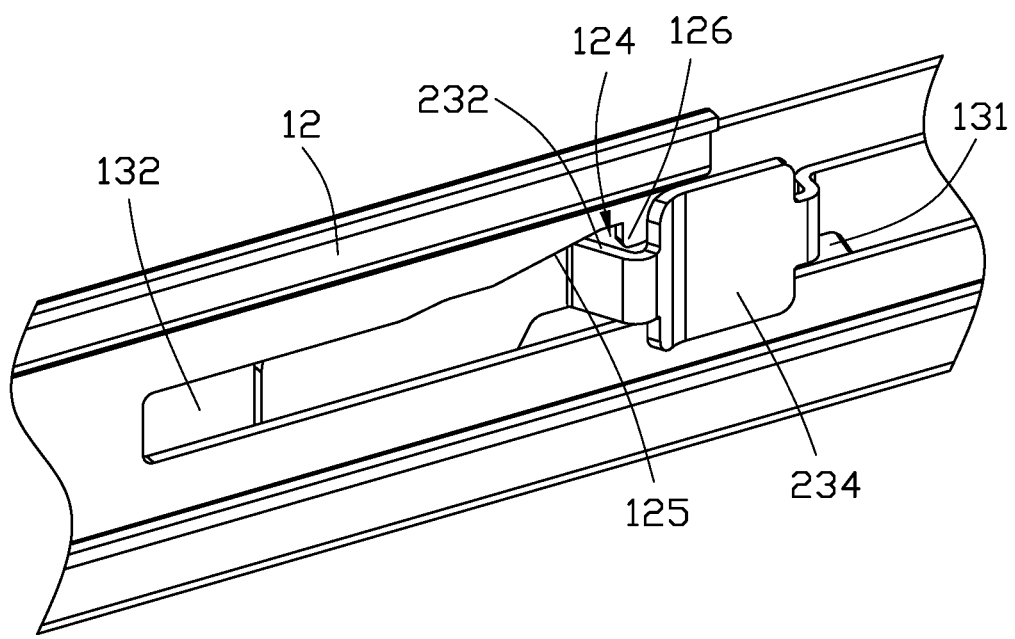
FIG. 7 is an enlarged view of a structure in which a locking portion of the cover plate is locked into a groove of the cabinet of FIG. 1.

Referring to FIG. 7. when the cabinet 10 and the cover plate 20 are locked, an external force acting on the cover plate 20 to forcibly open the cabinet 10 causes the cover plate 20 to deform and arch upward. The locking member (not shown) prevents the cover plate 20 from moving closer to the through hole 221, and the locking portion 232 of the first hook structure 231 slides along the slot wall 128 from the second sub chute 132 to the first sub chute 131.

When the locking portion 232 moves to the inclined plane 125, the locking portion 232 slides along the inclined plane 125 into the bottom of the groove 124 and is blocked by the blocking portion 126, the bottom of the groove 124, the inclined plane 125, and the blocking portion 126 are held by each other. Since the locking member (not shown) blocks the cover plate 20 from moving toward the through hole 221 and the cover plate 20 is deformed and arched upward, the first hook structure 231 and the first chute 13 are under stress. Therefore, even if the external force is removed, such stress makes it difficult for the locking portion 232 to fall back from the groove 124 to the second sub chute 132, preventing the cover plate 20 from continuing to move and preventing separation of the cover plate 20 from the cabinet 10. Under such stress, the cover plate 20 cannot be detached from the cabinet 10 even if the external force is repeated and applied many times.

When the external force stops acting on the cover plate 20, the locking member (not shown) is opened, and the cover plate 20 moves toward the through hole 221, so that the stress between the first hook structure 231 and the first chute 13 is released. The locking portion 232 is detached from the groove 124, that is, the locking portion 232 and the inclined plane 125 and the blocking portion 126 are no longer in contact with each other. The computer enclosure 100 can be opened in following manner.

When the cover plate 20 is deformed, the side of the cover plate 20 away from the through hole 221 is deformed to a greater degree, and the risk of the hook on this side detaching from the slide groove is greater.

Therefore, in the embodiment, the first chute 13 is disposed on a side of the cabinet 10 away from the through hole 221, and the first hook structure 231 is disposed on the cover plate 20 away from one side of the through hole 221.

In other embodiments, the first side plate 12 may also have at least one first chute 13, and the cover plate 20 may have at least one corresponding first hook structure 231.

Without restricting the position of the first hook structure 231, the security of the computer enclosure 100 can be enhanced to prevent the computer enclosure 100 from being forcibly opened.

In other embodiments, the computer enclosure 100 can also be provided with only one or more first chutes 13 and one or more corresponding first hook structures 231, Without the second chute 14 and the corresponding second hook structure 15, the security of the computer enclosure 100 can be enhanced and a forcible opening of the computer enclosure 100 can be prevented.

The materials of the cabinet 10 and the cover plate 20 include, but are not limited to, cold-rolled steel plate, electrolytic galvanized steel plate, acrylic, tempered glass, plastic, aluminum alloy, and other materials.

In the embodiment, the groove 124 is added to the first chute 13 and the locking portion 232 is provided in the first hook structure 231, thereby preventing the first hook structure 231 from disengaging from the first chute 13. The possibility of the cover plate 20 being forcibly opened is effectively reduced, and the safety of the computer enclosure 100 is improved.

The guiding plate 2341 is provided on the first fixing portion 234 to prevent the first fixing portion 234 from colliding with the blocking portion 126, so that the first hook structure 231 located on the first chute 13 slides more smoothly.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will, therefore, be appreciated that the exemplary embodiments described above may be modified within the scope of the claims.

What is claimed is:

1. A computer enclosure comprising:
a cabinet defining a first chute;
a cover plate comprising a first hook structure; wherein the first hook structure cooperates with the first chute to cover the cover plate on the cabinet;
wherein the cabinet defines a groove in the first chute, the first hook structure comprises a locking portion, and the locking portion is used to engage with the groove;
wherein the first chute comprises a first sub chute and a second sub chute, the first sub chute communicates with the second sub chute, and a width of the first sub chute is greater than a width of the second sub chute;
wherein the first hook structure further comprises a holding plate and a first fixing portion, the holding plate and the first fixing portion are spaced apart from each other, the holding plate is disposed on an outside of the cabinet, and the first fixing portion is disposed on an inside of the cabinet; and
wherein the width of the first sub chute is greater than a width of the first fixing portion, and the width of the second sub chute is less than the width of the first fixing portion, a width of the locking portion is less than the width of the first fixing portion.

2. The computer enclosure according to claim 1, wherein the cabinet comprises an inclined plane and a blocking portion, the inclined plane and the blocking portion together form the groove.

3. The computer enclosure according to claim 2, wherein the cabinet forms the inclined plane and the blocking portion at the second sub chute.

4. The computer enclosure according to claim 3, wherein the cabinet is formed with a slot wall at the second sub chute, the inclined plane is connected to the slot wall, and the inclined plane and the slot wall form an obtuse angle.

5. The computer enclosure according to claim 4, wherein the cabinet comprises a bottom plate and a first side plate vertically extending from both sides of the bottom plate, the first chute is formed on the first side plate, and the first side plate is formed with the inclined plane and the blocking portion where the first chute is away from the bottom plate.

6. The computer enclosure according to claim 4, wherein the first hook structure further comprises a main body, and the main body comprises the holding plate and a connecting plate extending from both ends of the holding plate, the locking portion extends from the connecting plate away from the connecting plate, the locking portion is fixedly connected to the first fixing portion.

7. The computer enclosure according to claim 4, wherein the cabinet is further formed with a first slot plate and a second slot plate at the first sub chute, the inclined plane and the blocking portion are formed on the second slot plate, the holding plate is disposed outside the first slot plate, and the first fixing portion is disposed inside of the first slot plate and the second slot plate.

8. The computer enclosure according to claim 4, wherein the cover plate comprises a top plate and a second side plate vertically extending from both sides of the top plate, the first hook structure is formed on an inner surface of the second side plate, the holding plate is away from the top plate relative to the first fixing portion.

9. A computer enclosure comprising:
a cabinet defining a first chute;
a cover plate comprising a first hook structure; wherein the first hook structure cooperates with the first chute to cover the cover plate on the cabinet;
wherein the cabinet defines a groove in the first chute, the first hook structure comprises a locking portion, a holding plate and a first fixing portion, and the locking portion is used to engage with the groove;
wherein the cabinet comprises an inclined plane and a blocking portion, the inclined plane and the blocking portion together form the groove, the first chute comprises a first sub chute and a second sub chute, the first sub chute communicates with the second sub chute, a width of the first sub chute is greater than a width of the second sub chute, and the cabinet forms the inclined plane and the blocking portion at the second sub chute;
wherein the cabinet is formed with a slot wall at the second sub chute, the inclined plane is connected to the slot wall, and the inclined plane and the slot wall form an obtuse angle; and wherein the cover plate comprises a top plate and a second side plate vertically extending from both sides of the top plate, the first hook structure is formed on an inner surface of the second side plate, the holding plate is away from the top plate relative to the first fixing portion.

10. The computer enclosure according to claim 9, wherein the cabinet comprises a bottom plate and a first side plate vertically extending from both sides of the bottom plate, the first chute is formed on the first side plate, and the first side plate is formed with the inclined plane and the blocking portion where the first chute is away from the bottom plate.

11. The computer enclosure according to claim 9, wherein the holding plate and the first fixing portion are spaced apart from each other, the holding plate is disposed on an outside of the cabinet, and the first fixing portion is disposed on an inside of the cabinet.

12. The computer enclosure according to claim 11, wherein the width of the first sub chute is greater than a width of the first fixing portion, and the width of the second sub chute is less than the width of the first fixing portion, a width of the locking portion is less than the width of the first fixing portion.

13. The computer enclosure according to claim 11, wherein the first hook structure further comprises a main body, and the main body comprises the holding plate and a connecting plate extending from both ends of the holding plate, the locking portion extends from the connecting plate away from the connecting plate, the locking portion is fixedly connected to the first fixing portion.

14. The computer enclosure according to claim 11, wherein the cabinet is further formed with a first slot plate and a second slot plate at the first sub chute, the inclined plane and the blocking portion are formed on the second slot plate, the holding plate is disposed outside the first slot plate, and the first fixing portion is disposed inside of the first slot plate and the second slot plate.

\* \* \* \* \*